United States Patent
Yoshida et al.

(10) Patent No.: US 10,770,876 B2
(45) Date of Patent: Sep. 8, 2020

(54) ELECTRICAL CONNECTION BOX AND GROUND CONNECTION STRUCTURE THEREOF

(71) Applicant: Yazaki Corporation, Tokyo (JP)

(72) Inventors: Naoyuki Yoshida, Makinohara (JP); Jin Watanabe, Makinohara (JP); Shoya Shinogaya, Makinohara (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 16/581,968

(22) Filed: Sep. 25, 2019

(65) Prior Publication Data

US 2020/0136360 A1  Apr. 30, 2020

(30) Foreign Application Priority Data

Oct. 29, 2018  (JP) ................... 2018-203145

(51) Int. Cl.
| | |
|---|---|
| *H02G 3/08* | (2006.01) |
| *H05K 9/00* | (2006.01) |
| *H05K 5/03* | (2006.01) |
| *B60R 16/023* | (2006.01) |
| *H05K 5/02* | (2006.01) |

(52) U.S. Cl.
CPC ......... *H02G 3/081* (2013.01); *B60R 16/0239* (2013.01); *H05K 5/0221* (2013.01); *H05K 5/03* (2013.01); *H05K 9/0064* (2013.01)

(58) Field of Classification Search
CPC ...... H02G 3/081; H02G 3/08; B60R 16/0239; H05K 5/0221; H05K 5/03; H05K 9/0064
See application file for complete search history.

(56) References Cited

U.S. PATENT DOCUMENTS

| | | | | |
|---|---|---|---|---|
| 5,012,043 A | * | 4/1991 | Seymour | H02G 3/18 174/57 |
| 5,770,817 A | * | 6/1998 | Lo | H02G 3/086 174/53 |
| 6,033,269 A | * | 3/2000 | Sekido | B60R 16/0239 439/796 |
| 6,309,248 B1 | * | 10/2001 | King | H01R 13/7135 439/535 |

(Continued)

FOREIGN PATENT DOCUMENTS

JP  2013-226019 A  10/2013

*Primary Examiner* — Abdullah A Riyami
*Assistant Examiner* — Nader J Alhawamdeh
(74) *Attorney, Agent, or Firm* — Sughrue Mion, PLLC

(57) ABSTRACT

An electrical connection box includes an outer box and an inner box to be accommodated in the outer box. The outer box includes an outer box body, a first lock portion to lock the inner box and a ground member to be electrically connected to a ground conductor, the ground member including a first ground contact portion provided at or adjacent to the first lock portion. The inner box includes an inner box body, a second lock portion to be engaged with the first lock portion, a ground circuit element to which the circuit base is connected to ground the circuit base and a contact conductor electrically connected to the ground circuit element, the contact conductor including a second ground contact portion to be electrically connected to the first ground contact portion when the first lock portion and the second lock portion are engaged with each other.

5 Claims, 3 Drawing Sheets

(56) References Cited

U.S. PATENT DOCUMENTS

| | | | | |
|---|---|---|---|---|
| 7,038,131 | B1* | 5/2006 | Gretz | H02G 3/086 |
| | | | | 174/50 |
| 7,468,486 | B2* | 12/2008 | Yan | H02G 3/123 |
| | | | | 174/50 |
| 8,680,394 | B2* | 3/2014 | Korcz | H02G 3/20 |
| | | | | 174/58 |
| 9,553,438 | B2* | 1/2017 | Korcz | H02G 3/185 |
| 10,153,602 | B2* | 12/2018 | Wolfson | H01R 25/16 |
| 10,256,614 | B2* | 4/2019 | Korcz | H02G 3/14 |
| 2010/0218969 | A1* | 9/2010 | Purves | H02G 3/12 |
| | | | | 174/59 |
| 2014/0202758 | A1* | 7/2014 | Lolachi | H02B 1/40 |
| | | | | 174/481 |
| 2017/0288381 | A1* | 10/2017 | Babbar | H02G 5/08 |
| 2020/0136360 | A1* | 4/2020 | Yoshida | H05K 5/0221 |

* cited by examiner

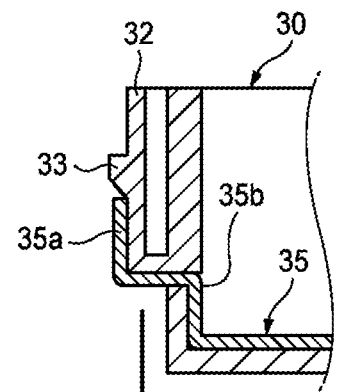
FIG. 3A
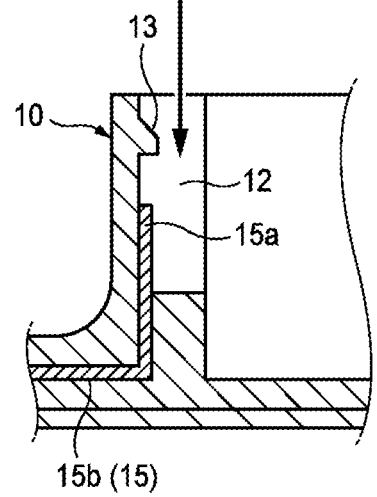
FIG. 3B
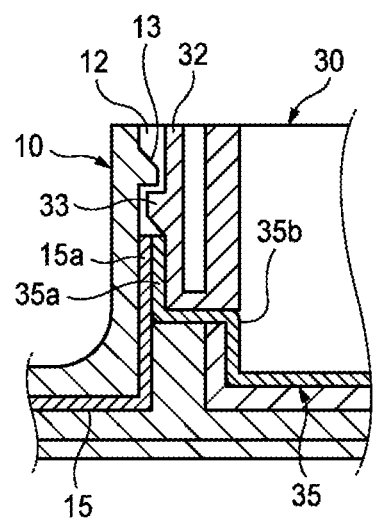

ELECTRICAL CONNECTION BOX AND GROUND CONNECTION STRUCTURE THEREOF

CROSS-REFERENCE TO RELATED APPLICATION

The present application claims priority to Japanese Patent Application No. 2018-203145 filed on Oct. 29, 2018, the entire content of which is incorporated herein by reference.

TECHNICAL FIELD

The present invention relates to an electrical connection box mounted on a vehicle and a ground connection structure thereof.

BACKGROUND

An electrical connection box that connects a battery and various electric devices is mounted on a vehicle (see, JP2013-226019A). Electric components (relays, fuses, and the like) and circuit bases (circuit boards, bus bars, and the like) are mounted on the electrical connection box.

Grounding conductors are provided in a part of the circuit bases, and many of the ground conductors are connected to ground points outside the electrical connection box by a conductor wire such as an electric wire in a properly aggregated form. Alternatively, a ground circuit is incorporated in a connector in the electrical connection box so that a ground conductor is grounded through a ground circuit of a mating connector.

However, the related art electrical connection box has an integral structure with the electric component and circuit bases. Accordingly, the entire electrical connection box has to be designed and manufactured every time specifications of electric components or circuit bases change, resulting in a high cost of the electrical connection box.

SUMMARY

Illustrative aspects of the present invention provide an electrical connection box and a ground connection structure thereof that can reduce the cost of design and manufacture by isolating a commonly used portion of the electrical connection box even with different specifications of electric components and circuit bases.

According to an illustrative aspect of the invention, an electrical connection box includes an outer box configured to be fixed to a fixing target and an inner box configured to be detachably accommodated in the outer box. The outer box includes an outer box body having an accommodation space to accommodate the inner box, a first lock portion provided on the outer box body to lock the inner box when the inner box is accommodated in the outer box body and a ground member provided on the outer box body and configured to be electrically connected to a ground conductor provided outside the outer box body, the ground member including a first ground contact portion provided at or adjacent to the first lock portion in an exposed manner. The inner box includes an inner box body in which an circuit base is to be loaded, the inner box body being configured to be detachably accommodated in the outer box body, a second lock portion provided on the inner box body and configured to be engaged with the first lock portion of the outer box when the inner box body is accommodated in the outer box body, a ground circuit element provided in the inner box body and to which the circuit base is connected to ground the circuit base and a contact conductor electrically connected to the ground circuit element and provided on the inner box body, the contact conductor including a second ground contact portion configured to be electrically connected to the first ground contact portion of the outer box when the first lock portion and the second lock portion are engaged with each other.

Other aspects and advantages of the invention will be apparent from the following description, the drawings and the claims.

BRIEF DESCRIPTION OF THE DRAWINGS

FIGS. 3A and 3B are enlarged cross-sectional views of peripheral structures of a lock mechanism in FIGS. 2A and 2B;

FIG. 3A is a cross-sectional view showing a state before the inner box is accommodated in the outer box; and FIG. 3B is a cross-sectional view showing a state after the inner box is accommodated in the outer box.

DESCRIPTION OF EMBODIMENTS

Figure 1:
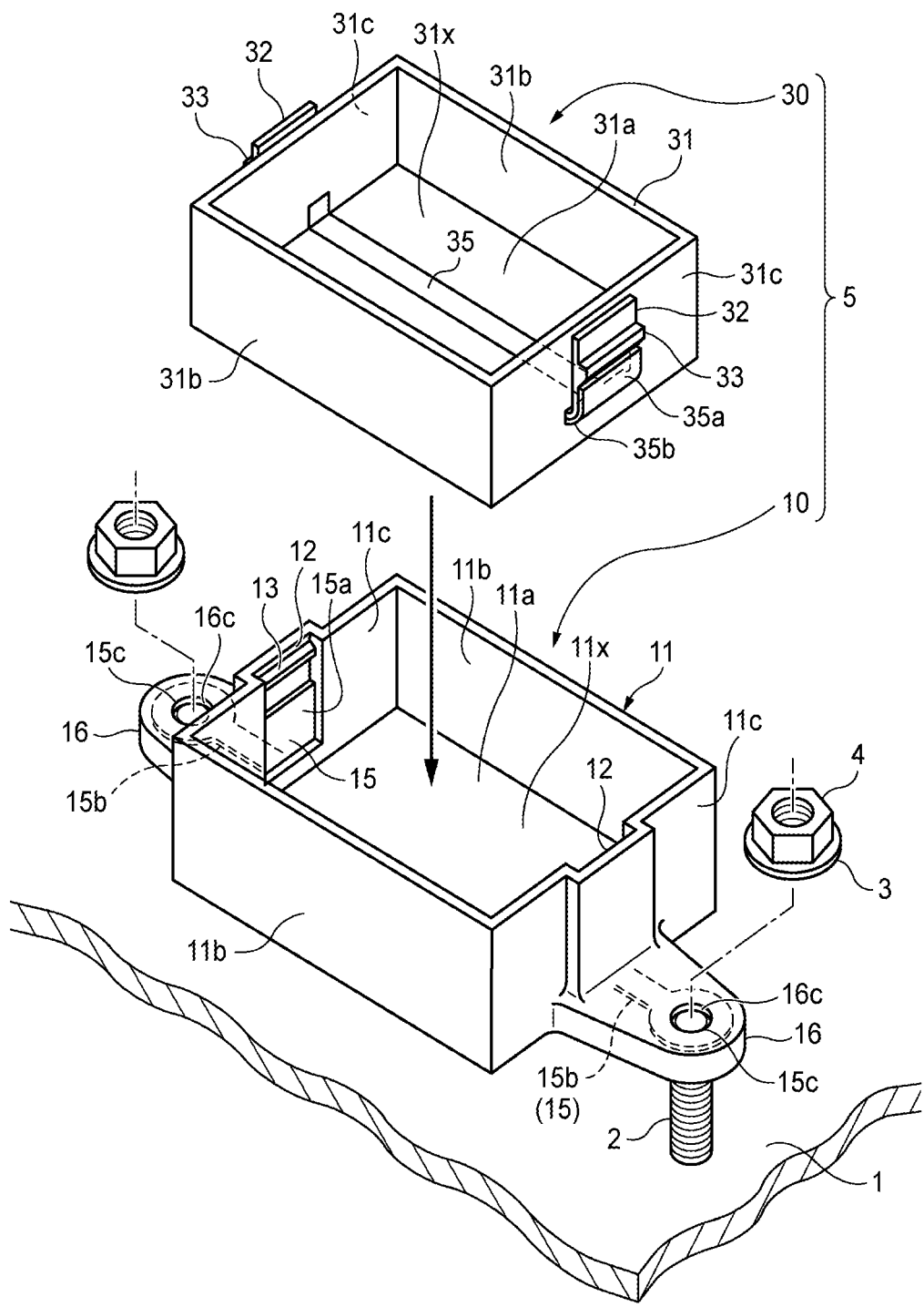
FIG. 1 is an exploded perspective view showing an electrical connection box and a ground connection structure thereof according to an embodiment of the present invention.
Figure 2A:
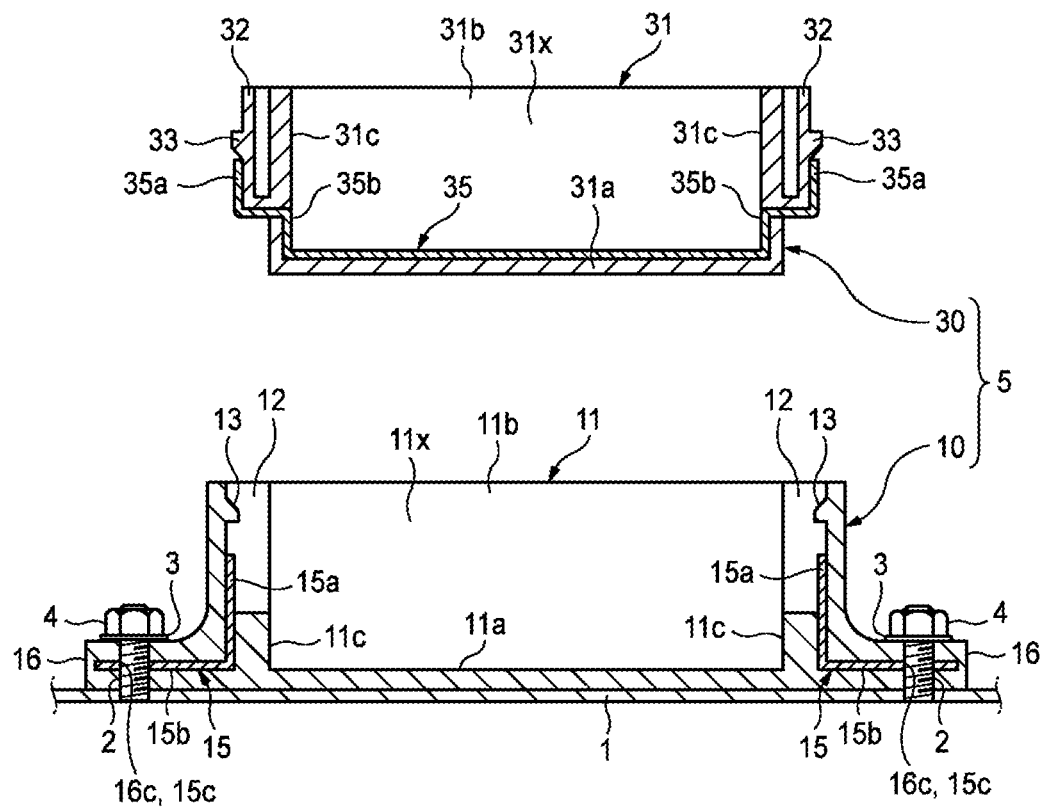
FIG. 2A is a cross-sectional view showing a state before an inner box is accommodated in an outer box.

Hereinafter, exemplary embodiments of the present invention will be described in detail with reference to the drawings. FIG. 1 is an exploded perspective view showing an electrical connection box and a ground connection structure thereof according to the embodiment. FIG. 2A is a cross-sectional view showing a state before an inner box is accommodated in an outer box and FIG. 2B is a cross-sectional view showing a state after the inner box is accommodated in the outer box.

Figure 2B:
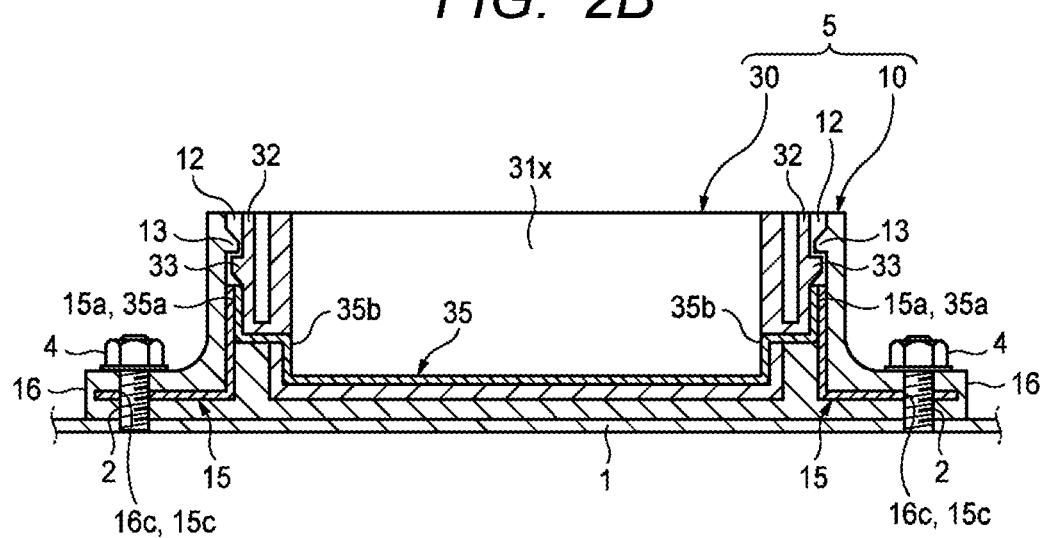
FIG. 2B is a cross-sectional view showing a state after the inner box is accommodated in the outer box.

As shown in FIGS. 1, 2A and 2B, an electrical connection box 5 in the present embodiment is to be fixed to a vehicle body 1 of an automobile, a fixing target, with bolts 2 and is divided into two of an outer box 10 and an inner box 30.

The outer box 10 is configured to be fixed directly to the vehicle body 1 (an example of a fixing target). The inner box 30 is configured to be detachably accommodated in the outer box 10. Circuit bases are to be mounted in the inner box 30 according to specifications, for example, electric components including relays and fuses, bus bars, and circuit boards.

The outer box 10 includes a resin-made outer box body 11 having an accommodation space 11x to accommodate the inner box 30. The outer box body 11 includes a rectangular bottom wall 11a and four side walls 11b, 11b, 11c, and 11c extending upward from peripheral edges of the bottom wall 11a. An upper part of the outer box body 11 is opened to accommodate the inner box 30.

A pair of opposite side walls 11c and 11c of the outer box body 11 includes a lock groove 12 from above to below on inner surfaces (inner walls) of the opposite side walls 11c and 11c. The lock groove 12 includes a lock protrusion 13 on an inner surface of the bottom of the lock groove 12 (a portion of the inner surface of each of the side walls 11c) thereof. The lock protrusion 13 is an example of a first lock portion configured to lock the inner box 30 when the inner box 30 is accommodated in the outer box body 11.

A metal ground member 15 is embedded in the pair of side walls 11c is and 11c. The ground member 15 is integrated with the outer box body 11 by insert-molding the outer box body 11 with the ground member 15. The ground member 15 is embedded in the side wall 11c of the outer box body 11 in a state where a ground contact portion 15a (first ground contact portion) on one end side is exposed to a lower side (vicinity of the first lock portion) of the lock protrusion 13. The other end side of the ground member 15 is a grounding metal strip 15b extending to the outside of the outer box body 11.

The pair of side walls 11c and 11c includes fixing brackets 16 extending respectively to the outside of bottoms the side walls 11c and 11c. The fixing bracket 16 is formed of an arm-shaped resin. The fixing bracket 16 is a part for fixing the outer box 10 to the vehicle body 1. The grounding metal strip 15b is embedded in the fixing bracket 16.

In the present embodiment, a stud bolt is used as the bolt 2 to fix the outer box 10 to the vehicle body 1 (hereinafter, the bolt 2 is also referred to as the stud bolt 2). The stud bolt 2 is erected on the vehicle body 1 as a ground point (corresponding to a ground conductor). The fixing bracket 16 is to be fixed to the vehicle body 1 by inserting the stud bolt 2 into a bolt through hole 16c running through a distal end portion of the fixing bracket 16 and screwing a nut 4 to the stud bolt 2 from above via a washer 3.

A through hole 15c, whose inner periphery is exposed to an inner peripheral surface of the bolt through hole 16c, is provided at a distal end portion of the grounding metal strip 15b. Therefore, by inserting the stud bolt 2 into the bolt through hole 16c, the stud bolt 2 becomes electrically connected with an inner peripheral surface of the through hole 15c of the grounding metal strip 15b. Accordingly, the ground member 15 and the bolt 2 becomes electrically connected with each other.

In order to form the through hole 15c having a sufficient size at the distal end portion of the grounding metal strip 15b, the entire grounding metal strip 15b may have a corresponding width or only the distal end portion may be wide. Further, the distal end portion of the grounding metal strip 15b may be provided with a circular plate portion to form the through hole 15c therein.

The inner box 30 includes a resin-made inner box body 31 that is detachably accommodated in the outer box body 11. The inner box body 31 may have various forms according to specifications of electric components and circuit bases mounted thereon. In the illustrated example, the inner box body 31 has a box shape and can accommodate electric components and circuit bases in an internal space 31x. The inner box body 31 also includes a rectangular bottom wall 31a and four side walls 31b, 31b, 31c, and 31c extending upward from peripheral edges of the bottom wall 31a. An upper part of the inner box body 31 is opened.

A pair of opposite side walls 31c and 31c of the inner box body 31 includes a lock arm 32, which is insertable into the lock groove 12 of the outer box 10 from above, on outer surfaces (outer walls) of opposite side walls 31c and 31c. An outer surface of the side wall 31c of the inner box body 31 and an inner surface of the side wall 11c of the outer box body 11 are an inner side wall and an outer side wall that are parallel in an accommodation direction, to which the inner box body 31 is to be put into the outer box body 11, and face each other when the inner box body 31 is accommodated in the outer box body 11. An inner bottom surface of the lock groove 12 of the outer box 10 is also an inner side wall.

The lock arm 32 is a cantilever arm whose free end extends upward from a fixed end of a lower end fixed to the side wall 31c of the inner box body 31. The lock arm 32 is flexible and can bend in a direction orthogonal to the outer surface of the side wall 31c of the inner box body 31.

The lock arm 32 includes an engagement protrusion 33 on an outer surface (a surface facing a direction in which the lock arm 32 springs back from a bent condition) thereof at the side of the free end of the lock arm 32, so as to lock the inner box body 31 to the outer box body 11 by engaging the engagement protrusion 33 with the lock protrusion 13 on the outer box 10 when the inner box body 31 is accommodated in the outer box body 11.

The flexible lock arm 32 bends and becomes deformed in response to the engagement protrusion 33 going over and thereby contacting the lock protrusion 13 when the inner box body 31 is put into the outer box body 11. The lock arm 32 springs back from the flexural deformation after going over the lock protrusion 13 and the engagement protrusion 33 becomes engaged with the lock protrusion 13 accordingly.

The inner box body 31 includes a ground circuit element 35 that serves as a target member for ground connection with ground electric components and circuit bases loaded therein. The inner box body 31 includes a contact conductor 35b electrically connected to the ground circuit element 35. The ground circuit element 35 and the contact conductor 35b are integrated with the inner box body 31 by insert-molding the inner box body 31.

One end of the contact conductor 35b serves as a ground contact portion 35a (second ground contact portion) that is exposed to the outer surface (a surface facing the direction in which the lock arm 32 springs back from the bent condition) of the lock arm 32 below the engagement protrusion 33. The ground contact portion 35a becomes electrically connected with the ground contact portion 15a on the outer box 10 when the lock protrusion 13 and the lock arm 32 are engaged with each other accompanying the accommodation of the inner box body 31 into the outer box body 11.

To fix the electrical connection box 5 to the stud bolt 2 of the vehicle body 1, the stud bolt 2 is to be inserted into the bolt through hole 16c on the distal end portion of the fixing bracket 16 and the nut 4 is to be screwed to an upper portion of the stud bolt 2 via the washer 3. Accordingly, the fixing bracket 16 is fixed to the vehicle body 1. The ground member 15 in the outer box 10 is electrically connected to the stud bolt 2. That is, the ground connection of the electrical connection box 5 is established simply by fixing the outer box 10 at the fixing bracket 16 of the electrical connection box 5 to the vehicle body 1 with the stud bolt 2.

Next, effects will be described. According to the electrical connection box 5 in the above embodiment, the inner box 30 alone may be designed and manufactured according to specifications of electric components and circuit bases while the outer box 10 can be used commonly even with different specifications of electric components and circuit bases. Therefore, the overall design and manufacturing cost of the electrical connection box 5 can be reduced, even when the specifications of electric components and circuit bases varies, in other words, even when variations of the inner box 30 occur.

As shown in FIGS. 2A, 2B, 3A, and 3B, the ground contact portion 35a on the inner box 30 can be electrically connected with the ground contact portion 15a on the outer box 10 by accommodating the inner box 30 in the outer box 10 and engaging the lock arm 32 with the lock protrusion 13. That is, the ground circuit element 35 in the inner box 30 can be electrically connected to the ground member 15 on the outer box 10. Therefore, it is possible to easily establish the ground connection of the inner box 30 via the outer box 10 simply by connecting the ground member 15 on the outer box 10 to a ground conductor (herein the stud bolt 2) outside the outer box 10 in advance and accommodating and locking the inner box 30 in the outer box 10.

At this time, the ground contact portion 35*a* on the inner box 30 is provided on the surface facing the direction in which the flexible lock arm 32 springs back from the bent condition. Therefore, the ground contact portion 35*a* on the lock arm 32 is to be elastically pressed and brought into contact with the ground contact portion 15*a* on the lock protrusion 13 by using an elastic restoring force of the lock arm 32. As a result, it is possible to ensure good contact conductance between the ground contact portions 15*a* and 35*a*.

Regarding the ground connection of the outer box 10, the ground member 15 can be grounded to the vehicle body via the bolt 2 by inserting the stud bolt 2 into the bolt through hole 16*c* on the distal end portion of the fixing bracket 16 and fixing the outer box 10 at the fixing bracket 16 to the vehicle body 1 (fixing target) by the bolt 2. That is, it is possible to establish the ground connection of the ground circuit element 35 in the inner box 30 via the outer box 10 simply by fixing the outer box 10 at the fixing bracket 16 of the outer box 10 to the vehicle body 1 (fixing target) with the bolt 2. Therefore, conductor wires such as grounding electric wires can be saved and steps for designing, manufacturing, and assembling can be simplified.

While the present invention has been described with reference to a certain exemplary embodiment thereof, the scope of the present invention is not limited to the exemplary embodiment described above, and it will be understood by those skilled in the art that various changes and modifications may be made therein without departing from the scope of the present invention as defined by the appended claims.

For example, in the embodiment describe above, the lock arm 32 is provided on the inner box 30 and the lock protrusion 13 is provided on the outer box 10. However, a lock protrusion may be provided on the inner box 30 and a lock arm may be provided on the outer box 10.

In the embodiment described above, the lock protrusion 13 and the lock arm 32 including the engagement protrusion 33 are provided as an example of a combination of the first lock portion and the second lock portion. However, any configuration may be adopted for the combination of the first and second lock portions.

While the ground connection of the outer box 10 to the vehicle body 1 is performed through the fixing bracket 16 in the embodiment described above, the ground connection is not always necessarily realized with the fixing bracket 16. For example, a ground terminal may be provided in the outer box 10 to be connected to a ground point on the vehicle body 1 via a conductor wire.

In the embodiment described above, the grounding metal strip 15*b* and the stud bolt 2 are electrically connected with each other by exposing the inner periphery of the through hole 15*c* of the grounding metal strip 15*b* to the inner peripheral surface of the bolt through hole 16*c* of the fixing bracket 16. However, the present invention is not limited thereto, for example, a cylindrical conductor may be disposed on the inner peripheral surface of the bolt through hole 16*c* and connected to the distal end portion of the grounding metal strip 15*b*, so that an inner hole of the cylindrical conductor may serve as a substantially bolt through hole.

According to the exemplary embodiments described above, an electrical connection box (5) includes an outer box (10) configured to be fixed to a fixing target (vehicle body 1) and an inner box (30) configured to be detachably accommodated in the outer box. The outer box (10) includes an outer box body (11) having an accommodation space (11*x*) to accommodate the inner box (30), a first lock portion (lock protrusion 13) provided on the outer box body (11) to lock the inner box (30) when the inner box (30) is accommodated in the outer box body (11) and a ground member (15) provided on the outer box body (11) and configured to be electrically connected to a ground conductor (bolt 2) provided outside the outer box body (11), the ground member (15) including a first ground contact portion (15*a*) provided at or adjacent to the first lock portion (lock protrusion 13) in an exposed manner. The inner box (30) includes an inner box body (31) in which an circuit base is to be loaded, the inner box body (31) being configured to be detachably accommodated in the outer box body (11), a second lock portion (32) provided on the inner box body (31) and configured to be engaged with the first lock portion (lock protrusion 13) of the outer box (10) when the inner box body (31) is accommodated in the outer box body (11), a ground circuit element (35) provided in the inner box body (31) and to which the circuit base is connected to ground the circuit base and a contact conductor (35*b*) electrically connected to the ground circuit element (35) and provided on the inner box body (31), the contact conductor (35*b*) including a second ground contact portion (35*a*) configured to be electrically connected to the first ground contact portion (15*a*) of the outer box (10) when the first lock portion (lock protrusion 13) and the second lock portion (lock arm 32) are engaged with each other.

According to the electrical connection box having the above configuration, the inner box alone may be designed and manufactured according to specifications of electric components and circuit bases while the outer box can be used commonly even when specifications of electric components and circuit bases are different. Therefore, the overall design and manufacture cost of the electrical connection box can be reduced, even when the specifications of electric components and circuit bases varies, in other words, even when variations of the inner box occur.

Further, the ground circuit element in the inner box can be electrically connected to the ground member on the outer box just by accommodating and locking the inner box in the outer box. Therefore, if the ground member on the outer box is being grounded to an external ground point and the like in advance, it is possible to easily establish the ground connection of the inner box via the outer box simply by accommodating and locking the inner box in the outer box.

The outer box body (11) may further include a side wall (11*c*) having an inner surface and the inner box body (31) may further include a side wall (31*c*) having an outer surface. The side wall (11*c*) of the outer box body (11) and the side wall (31*c*) of the inner box body (31) extend in a direction parallel to an accommodation direction in which the inner box body (31) enters the outer box body (11) and the inner surface of the outer box body (11) and the outer surface of the inner box body (31) face each other when the inner box body (31) is being accommodated in the outer box body (11). The first lock portion may include a lock protrusion (13) provided on the inner surface of the outer box body (11). The second lock portion may include a lock arm (32) including an engagement protrusion (33) to be engaged with the lock protrusion (13), the lock arm (32) provided on the outer surface of the inner box body (31). The lock arm (32)

is deformed in a bent manner by the engagement protrusion (33) sliding over the lock protrusion (13) when the inner box body (31) enters the outer box body (11) and the engagement protrusion (33) engages with the lock protrusion (13) by the lock arm (22) springing back from a bent condition after the engagement protrusion (33) slides over the lock protrusion (13). The second ground contact portion (35a) is provided on a surface of the lock arm (32) facing a direction in which the lock arm (32) springs back from the bent condition, and the first ground contact portion (15a) is provided on a portion of the inner surface of the outer box body (11) configured to face the second ground contact portion (35a).

Alternatively, the second lock portion may include a lock protrusion (13) provided on the outer surface of the inner box body (31). The first lock portion may include a lock arm (32) including an engagement protrusion (33) to be engaged with the lock protrusion (13), the lock arm (32) provided on the inner surface of the outer box body (11). The lock arm (32) is deformed in a bent manner by the engagement protrusion (33) sliding over the lock protrusion (13) when the inner box body (31) enters the outer box body (11) and the engagement protrusion (33) engages with the lock protrusion (13) by the lock aim (32) springing back from a bent condition after the engagement protrusion (33) slides over the lock protrusion (13). The first ground contact portion (15a) is provided on a surface of the lock arm (32) facing a direction in which the lock arm (32) springs back from the bent condition, and the second ground contact portion (35a) is provided on a portion of the outer surface of the inner box body (31) configured to face the first ground contact portion (15a).

According to the electrical connection box having the above configurations, one of the two ground contact portions is provided on the surface facing the direction in which the lock arm springs back from the bent condition. Therefore, the ground contact portion provided on the lock arm can be pressed by an elastic restoring force of the lock arm and brought into contact with the other ground contact portion. Therefore, it is possible to ensure good contact conductance between the ground contact portions.

The outer box (10) may further include a grounding metal strip (15b) extending from the ground member (15) to outside of the outer box body (11) a fixing bracket extending from and provided integrally with the outer box body (11) and enclosing the grounding metal strip (15b) and a bolt through hole (16c) running through a distal end portion of the fixing bracket (16) and to electrically connect the grounding metal strip (15b) to a bolt (2), the bolt to be inserted to fix the outer box (10) to the fixing target (for example, the vehicle body 1).

According to the electrical connection box having the above configuration, the grounding metal strip can be grounded to the vehicle body via the bolt by inserting the bolt into the bolt through hole on the distal end portion of the fixing bracket and fixing the outer box at the fixing bracket to the vehicle body (fixing target) by the bolt. That is, it is possible to establish the ground connection of the ground circuit element placed in the inner box simply by fixing the outer box at the fixing bracket of the electrical connection box to the vehicle body (fixing target) with the bolt. Therefore, conductor wires such as grounding electric wires can be saved and steps for designing, manufacturing, and assembling can be simplified.

A ground connection structure configured to ground the electrical connection box having the configuration described above includes the grounding metal strip (15b) configured to be grounded to the fixing target (vehicle body 1) by inserting the bolt (2) into the bolt through hole (16c) of the fixing bracket (16) and fixing the outer box (10) at the fixing bracket (16) to the fixing target (vehicle body 1) with the bolt (2).

According to the ground connection structure of the electrical connection box having the above configuration, the ground connection of the circuit base can be established simply by fixing the outer box at the fixing bracket of the electrical connection box to the fixing target by the bolt. Therefore, conductor wires such as grounding electric wires can be saved and steps for designing, manufacturing, and assembling can be simplified.

What is claimed is:

1. An electrical connection box comprising:
    an outer box configured to be fixed to a fixing target;
    an inner box configured to be detachably accommodated in the outer box, wherein the outer box comprises:
    an outer box body having an accommodation space to accommodate the inner box;
    a first lock portion provided on the outer box body to lock the inner box when the inner box is accommodated in the outer box body; and
    a ground member provided on the outer box body and configured to be electrically connected to a ground conductor provided outside the outer box body, the ground member including a first ground contact portion provided at or adjacent to the first lock portion in an exposed manner, and
    wherein the inner box comprises:
    an inner box body in which an circuit base is to be loaded, the inner box body being configured to be detachably accommodated in the outer box body;
    a second lock portion provided on the inner box body and configured to be engaged with the first lock portion of the outer box when the inner box body is accommodated in the outer box body;
    a ground circuit element provided in the inner box body and to which the circuit base is connected to ground the circuit base;
    a contact conductor electrically connected to the ground circuit element and provided on the inner box body, the contact conductor including a second ground contact portion configured to be electrically connected to the first ground contact portion of the outer box when the first lock portion and the second lock portion are engaged with each other.

2. The electrical connection box according to claim 1,
    wherein the outer box body further comprises a side wall having an inner surface,
    wherein the inner box body further comprises a side wall having an outer surface,
    wherein the side wall of the outer box body and the side wall of the inner box body extend in a direction parallel to an accommodation direction in which the inner box body enters the outer box body and the inner surface of the outer box body and the outer surface of the inner box body face each other when the inner box body is being accommodated in the outer box body,
    wherein the first lock portion comprises a lock protrusion provided on the inner surface of the outer box body,
    wherein the second lock portion comprises a lock arm including an engagement protrusion to be engaged with the lock protrusion, the lock arm provided on the outer surface of the inner box body,
    wherein the lock arm is deformed in a bent manner by the engagement protrusion sliding over the lock protrusion when the inner box body enters the outer box body and the engagement protrusion engages with the lock protrusion by the lock arm springing back from a bent condition after the engagement protrusion slides over the lock protrusion, and wherein the second ground contact portion is provided on a surface of the lock arm facing a direction in which the lock arm springs back from the bent condition, and the first ground contact portion is provided on a portion of the inner surface of the outer box body configured to face the second ground contact portion.

3. The electrical connection box according to claim 1, wherein the outer box body further comprises a side wall having an inner surface, wherein the inner box body further comprises a side wall having an outer surface, wherein the side wall of the outer box body and the side wall of the inner box body extend in a direction parallel to an accommodation direction to which the inner box body enters the outer box body and the inner surface of the outer box body and the outer surface of the inner box body face each other when the inner box body is being accommodated in the outer box body, wherein the second lock portion comprises a lock protrusion provided on the outer surface of the inner box body, wherein the first lock portion comprises a lock arm including an engagement protrusion to be engaged with the lock protrusion, the lock arm provided on the inner surface of the outer box body, wherein the lock arm is deformed in a bent manner by the engagement protrusion sliding over the lock protrusion when the inner box body enters the outer box body and the engagement protrusion engages with the lock protrusion by the lock arm springing back from a bent condition after the engagement protrusion slides over the lock protrusion, and wherein the first ground contact portion is provided on a surface of the lock arm facing a direction in which the lock arm springs back from the bent condition, and the second ground contact portion is provided on a portion of the outer surface of the inner box body configured to face the first ground contact portion.

4. The electrical connection box according to claim 1, the outer box further comprises:

a grounding metal strip extending from the ground member to outside of the outer box body;

a fixing bracket extending from and provided integrally with the outer box body and enclosing the grounding metal strip; and a bolt through hole running through a distal end portion of the fixing bracket and to electrically connect the grounding metal strip to a bolt, the bolt to be inserted to fix the outer box to the fixing target.

5. A ground connection structure configured to ground the electrical connection box comprising:

an electrical connection box;

a bolt; and a fixing target, wherein the electrical connection box comprises:

an outer box configured to be fixed to the fixing target;

an inner box configured to be detachably accommodated in the outer box, wherein the outer box comprises:

an outer box body having an accommodation space to accommodate the inner box;

a first lock portion provided on the outer box body to lock the inner box when the inner box is accommodated in the outer box body; and a ground member provided on the outer box body and configured to be electrically connected to a ground conductor provided outside the outer box body, the ground member including a first ground contact portion provided at or adjacent to the first lock portion in an exposed manner, and wherein the inner box comprises:

an inner box body in which an circuit base is to be loaded, the inner box body being configured to be detachably accommodated in the outer box body;

a second lock portion provided on the inner box body and configured to be engaged with the first lock portion of the outer box when the inner box body is accommodated in the outer box body;

a ground circuit element provided in the inner box body and to which the circuit base is connected to ground the circuit base; and a contact conductor electrically connected to the ground circuit element and provided on the inner box body, the contact conductor including a second ground contact portion configured to be electrically connected to the first ground contact portion of the outer box when the first lock portion and the second lock portion are engaged with each other, wherein the outer box comprises:

a grounding metal strip extending from the ground member to outside of the outer box body;

a fixing bracket extending from and provided integrally with the outer box body and enclosing the grounding metal strip; and a bolt through hole running through a distal end portion of the fixing bracket and to electrically connect the grounding metal strip to the bolt, the bolt to be inserted to fix the outer box to the fixing target, wherein the grounding metal strip is to be grounded to the fixing target by inserting the bolt into the bolt through hole of the fixing bracket and fixing the outer box at the fixing bracket to the fixing target with the bolt.

\* \* \* \* \*